United States Patent
Yang

(10) Patent No.: US 12,546,801 B2
(45) Date of Patent: Feb. 10, 2026

(54) WAFER STRUCTURE COMPRISING MULTIPLE CHIPS AND DUMMY CONNECTORS INCLUDING BONDING AND PROBING SEGMENTS

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 381 days.

(21) Appl. No.: 18/310,541

(22) Filed: May 2, 2023

(65) Prior Publication Data

US 2024/0371805 A1 Nov. 7, 2024

(51) Int. Cl.
*H01L 23/00* (2006.01)
*G01R 1/067* (2006.01)
*H01L 23/498* (2006.01)

(52) U.S. Cl.
CPC .......... *H01L 24/05* (2013.01); *G01R 1/06711* (2013.01); *H01L 23/49811* (2013.01); *H01L 2224/04042* (2013.01); *H01L 2224/05553* (2013.01)

(58) Field of Classification Search
CPC .............. G01R 1/06711; H01L 24/05; H01L 2224/04042; H01L 23/49811
USPC ................... 257/786; 438/612, 666
See application file for complete search history.

(56) References Cited

U.S. PATENT DOCUMENTS

| | | | |
|---|---|---|---|
| 2002/0117729 A1* | 8/2002 | Aiki | G01R 31/2884 257/459 |
| 2005/0082667 A1* | 4/2005 | Gibson | H01L 22/32 257/734 |
| 2010/0276816 A1* | 11/2010 | Ali | H01L 24/06 257/E21.59 |
| 2021/0167051 A1* | 6/2021 | Yu | H01L 24/20 |
| 2022/0013418 A1* | 1/2022 | Seo | H01L 22/32 |

FOREIGN PATENT DOCUMENTS

TW 201818483 A 5/2018

* cited by examiner

*Primary Examiner* — Didarul A Mazumder
(74) *Attorney, Agent, or Firm* — CKC & Partners Co., LLC

(57) ABSTRACT

A wafer structure includes a plurality of chips and a plurality of dummy connectors. The chips are separated from each other. Each of the chips includes a body and a plurality of conductive pads. The conductive pads are respectively and at least partially disposed on the body. The dummy connectors are connected with each other. Each of the dummy connectors is connected between adjacent two of the bodies. Each of the conductive pads is further at least partially disposed on a corresponding one of the dummy connectors.

15 Claims, 8 Drawing Sheets

WAFER STRUCTURE COMPRISING MULTIPLE CHIPS AND DUMMY CONNECTORS INCLUDING BONDING AND PROBING SEGMENTS

BACKGROUND

Technical Field

The present disclosure relates to wafer structures.

Description of Related Art

With regards to the rapid development of technology in recent years, electronic devices have become a very important part of our daily lives. Various types of advanced electronic devices can be commonly seen in different aspects.

In general, the quality of the chip(s) adopted in an electronic device determines the performance of this electronic device. Hence, a continuous improvement on the quality of chips is undoubtedly an important issue which the industry highly concerns.

SUMMARY

A technical aspect of the present disclosure is to provide a wafer structure, which can effectively reduce the area coverage of the conductive pads on the body of each of the chips while the portions of the conductive pads remained on the body of each of the chips after the chips are individually cut are free of scratches or damages.

According to an embodiment of the present disclosure, a wafer structure includes a plurality of chips and a plurality of dummy connectors. The chips are separated from each other. Each of the chips includes a body and a plurality of conductive pads. The conductive pads are respectively and at least partially disposed on the body. The dummy connectors are connected with each other. Each of the dummy connectors is connected between adjacent two of the bodies. Each of the conductive pads is further at least partially disposed on a corresponding one of the dummy connectors.

In one or more embodiments of the present disclosure, each of the conductive pads includes a bonding portion and a probing portion. The bonding portion is located on a corresponding one of the bodies. The probing portion is connected with the bonding portion and is located on a corresponding one of the dummy connectors. The probing portion is configured to be contacted by a probe.

In one or more embodiments of the present disclosure, each of the bonding portions and a corresponding one of the probing portions are integrally formed.

In one or more embodiments of the present disclosure, each of the bonding portions and a corresponding one of the probing portions are arranged along a first direction. Each of the bonding portions has a first width along a second direction perpendicular to the first direction. Each of the probing portions has a second width along the second direction. The first width and the second width are equal.

In one or more embodiments of the present disclosure, a range of each of the first widths is between 9 μm and 65 μm.

In one or more embodiments of the present disclosure, each of the probing portions is separated from an adjacent one of the bodies.

In one or more embodiments of the present disclosure, each of the bodies has a first top surface. Each of the dummy connectors has a second top surface coplanar with the first top surfaces. Each of the conductive pads is at least partially disposed on a corresponding one of the first top surfaces and at least partially disposed on a corresponding one of the second top surfaces.

In one or more embodiments of the present disclosure, each of the conductive pads is of a rectangular shape.

In one or more embodiments of the present disclosure, the chips are arranged in a matrix form.

In one or more embodiments of the present disclosure, the conductive pads are separated from each other.

According to another embodiment of the present disclosure, a wafer structure includes a dummy plate and a plurality of chips. The dummy plate has a plurality of through holes. Each of the chips includes a body, a plurality of bonding pads, a plurality of probing pads and a plurality of connecting wires. The body is connected with the dummy plate and is located within a corresponding one of the through holes. The bonding pads are disposed on the body. The probing pads are disposed on the dummy plate and are respectively configured to be contacted by a probe. The connecting wires are respectively and electrically connected between a corresponding one of the bonding pads and a corresponding one of the probing pads.

In one or more embodiments of the present disclosure, a size of each of the bonding pads and a size of a corresponding one of the probing pads are equal.

In one or more embodiments of the present disclosure, a size of each of the bonding pads and a size of a corresponding one of the probing pads are different.

In one or more embodiments of the present disclosure, the bonding pads are separated from each other. The probing pads are separated from each other.

In one or more embodiments of the present disclosure, each of the bonding pads has a contact area, a range of the contact area is between 100 μm$^2$ and 3600 μm$^2$.

The above-mentioned embodiments of the present disclosure have at least the following advantages:

(1) Since the bonding portion of each of the conductive pads has a relatively less area coverage over a corresponding one of the bodies, more area of the body of each of the chips can be released for other usage, which effectively facilitates the design improvement of the chips.

(2) Since scratches or damages due to testing by the probe will only be formed on the probing portion but not the bonding portion of each of the conductive pads, the bonding portions remained on the bodies after the process of cutting are free of scratches or damages due to testing by the probe, which effectively improves the subsequent processes of manufacture of the chips.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
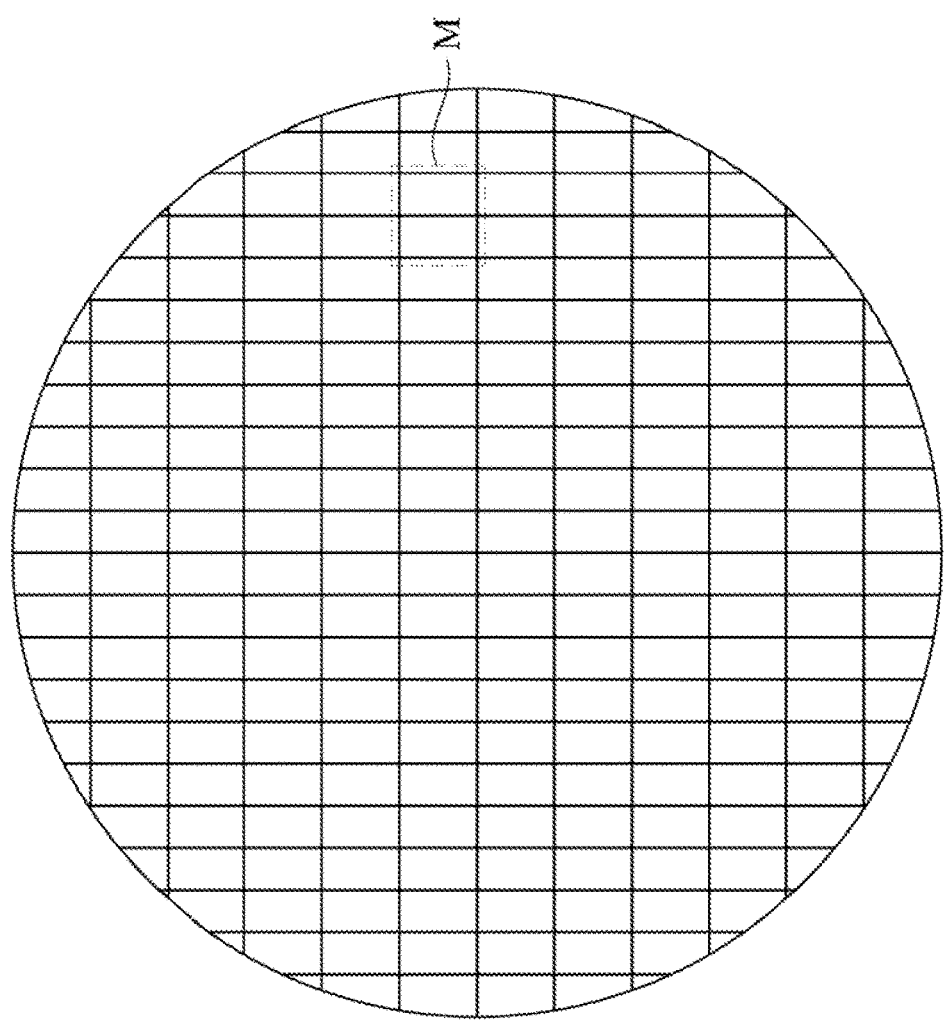
FIG. 1 is a top view of a wafer structure according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
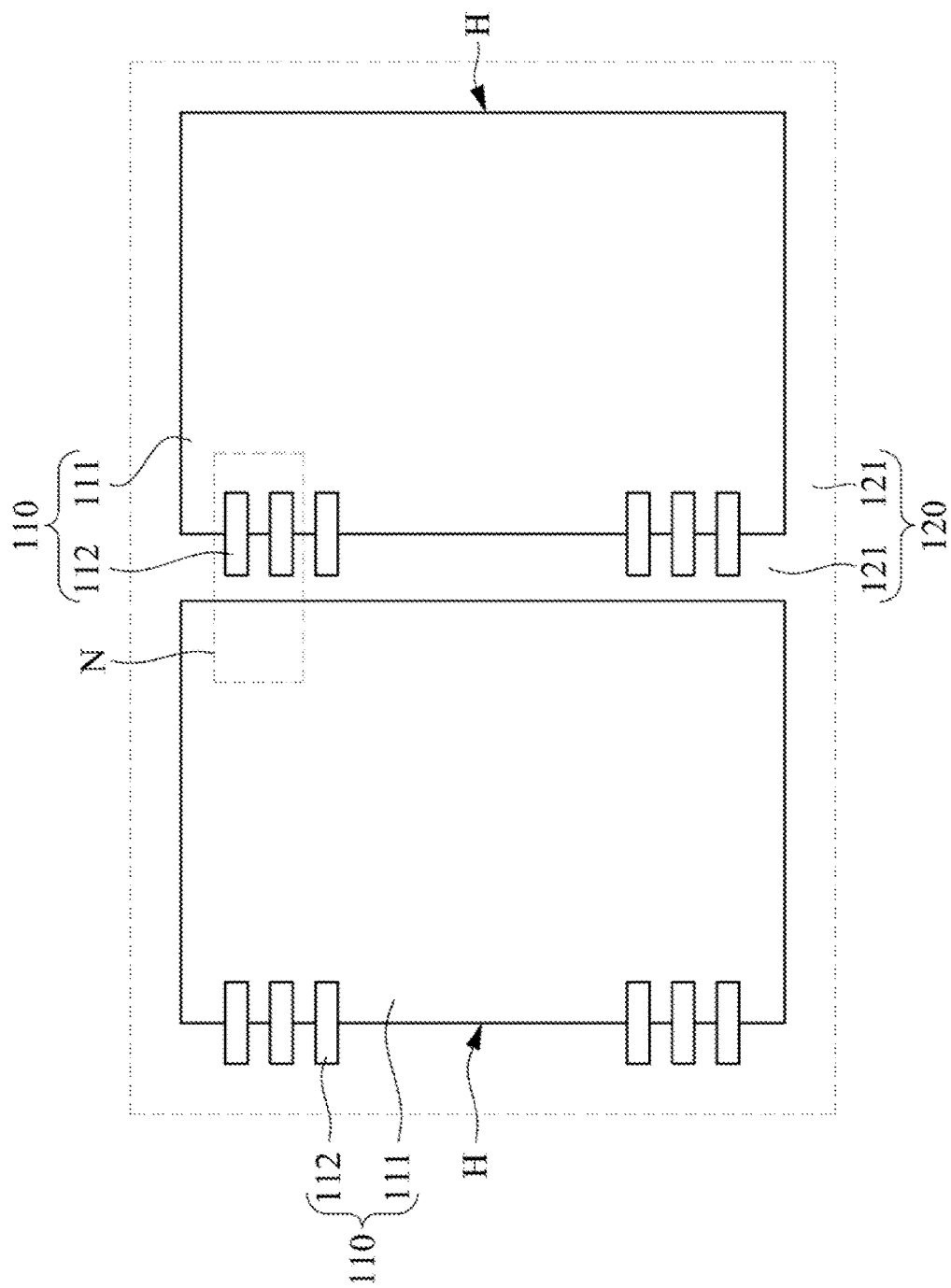
FIG. 2 is an enlarged view of the zone M of FIG. 1.

Reference is made to FIGS. 1-2. FIG. 1 is a top view of a wafer structure 100 according to an embodiment of the present disclosure. FIG. 2 is an enlarged view of the zone M of FIG. 1. In this embodiment, as shown in FIGS. 1-2, a wafer structure 100 includes a plurality of chips 110 and a dummy plate 120. The dummy plate 120 is formed from a plurality of dummy connectors 121 connected with each other, such that the dummy plate 120 has a plurality of through holes H defined by the dummy connectors 121. The chips 110 are separated from each other and are at least partially located within the through holes H. To be specific, the chips 110 are arranged in a matrix form. Furthermore, as shown in FIG. 2, each of the chips 110 includes a body 111 and a plurality of conductive pads 112. Each of the bodies 111 is located within a corresponding one of the through holes H. The conductive pads 112 are separated from each other and are respectively and at least partially disposed on the body 111. Each of the dummy connectors 121 is connected between adjacent two of the bodies 111. Moreover, each of the conductive pads 112 is further at least partially disposed on a corresponding one of the dummy connectors 121.

Figure 3:
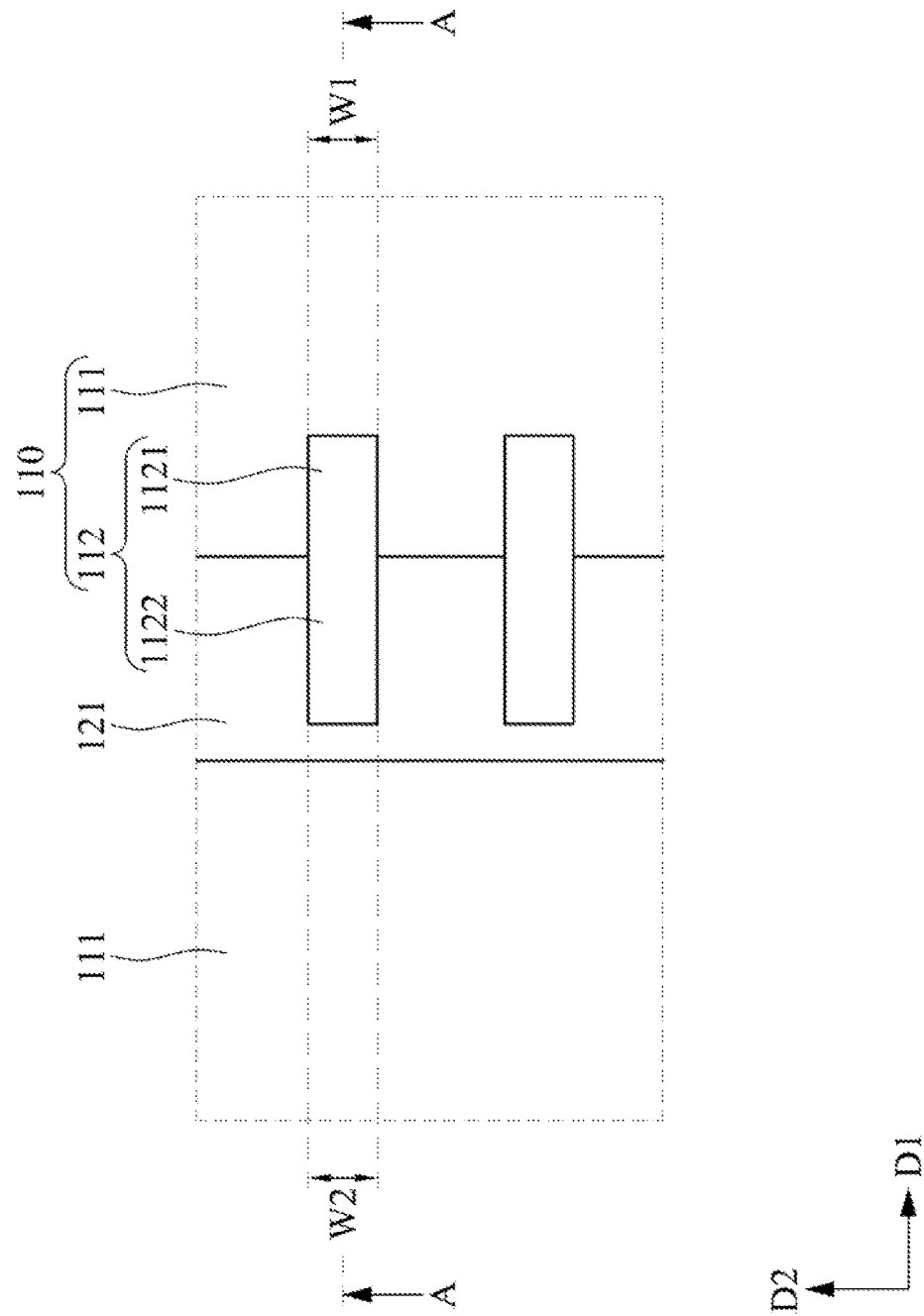
FIG. 3 is an enlarged view of the zone N of FIG. 2.

Reference is made to FIG. 3. FIG. 3 is an enlarged view of the zone N of FIG. 2. In this embodiment, as shown in FIG. 3, each of the conductive pads 112 includes a bonding portion 1121 and a probing portion 1122. The bonding portion 1121 is located on a corresponding one of the bodies 111. The probing portion 1122 is connected with the bonding portion 1121 and is located on a corresponding one of the dummy connectors 121. Moreover, each of the probing portions 1122 is separated from an adjacent one of the bodies 111 next to the body 111 where the bonding portion 1121 connected to this probing portion 1122 is located on. During testing of a particular one of the chips 110, a corresponding one of the probing portion 1122 is configured to be contacted by a probe 200 (please see FIG. 4 for the probe 200).

In addition, as shown in FIG. 3, each of the bonding portions 1121 and a corresponding one of the probing portions 1122 are arranged along a first direction D1. Each of the bonding portions 1121 has a first width W1 along a second direction D2. The second direction D2 is perpendicular to the first direction D1. Each of the probing portions 1122 has a second width W2 along the second direction D2. In this embodiment, the first width W1 of each of the bonding portions 1121 and the second width W2 of each of the probing portions 1122 are equal. In other words, each of the conductive pads 112 is of a rectangular shape. However, this does not intend to limit the present disclosure.

In practical applications, each of the bonding portions 1121 and a corresponding one of the probing portions 1122 are of a single structure integrally formed from the same piece of material.

Furthermore, for example, a range of each of the first widths W1 is between 9 μm and 65 μm. In other words, the bonding portion 1121 of each of the conductive pads 112 has a relatively less area coverage over a corresponding one of the bodies 111. In this way, more area of the body 111 of each of the chips 110 can be released for other usage, which effectively facilitates the design improvement of the chips 110.

Figure 4:
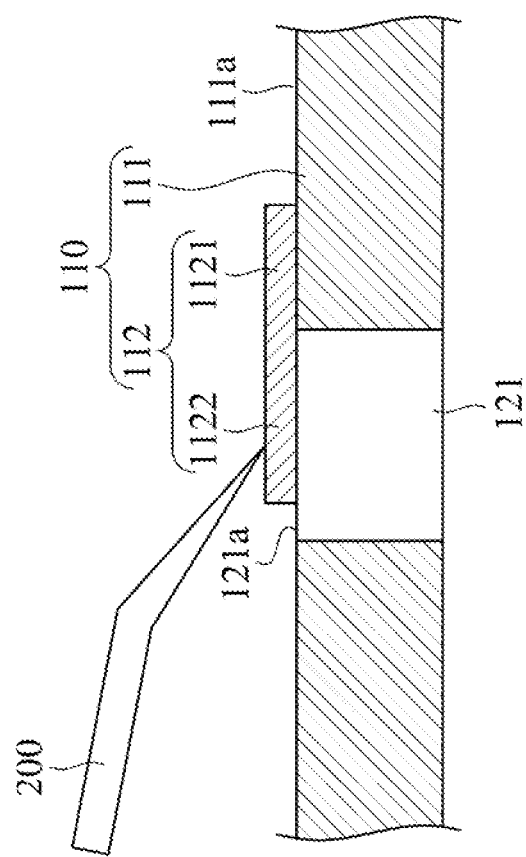
FIG. 4 is a cross-sectional view along the sectional line A-A of FIG. 3, in which a probe is in contact with the probing portion.

Reference is made to FIG. 4. FIG. 4 is a cross-sectional view along the sectional line A-A of FIG. 3, in which a probe 200 is in contact with the probing portion 1122. In this embodiment, as shown in FIG. 4, each of the bodies 111 has a first top surface 111a while each of the dummy connectors 121 has a second top surface 121a coplanar with the first top surfaces 111a. Moreover, in practice, each of the conductive pads 112 is at least partially disposed on a corresponding one of the first top surfaces 111a and at least partially disposed on a corresponding one of the second top surfaces 121a.

Moreover, it is worth to note that, as shown in FIG. 4, since a probe 200 is only in contact with the probing portion 1122 but not the bonding portion 1121 during testing of a corresponding one of the chips 110, even if scratches or damages may be formed on the conductive pad 112 when the probe 200 is pressed against the conductive pad 112, scratches or damages will only be formed on the probing portion 1122 but not the bonding portion 1121. In other words, the bonding portion 1121 will be free of scratches or damages due to testing by the probe 200.

Figure 6:
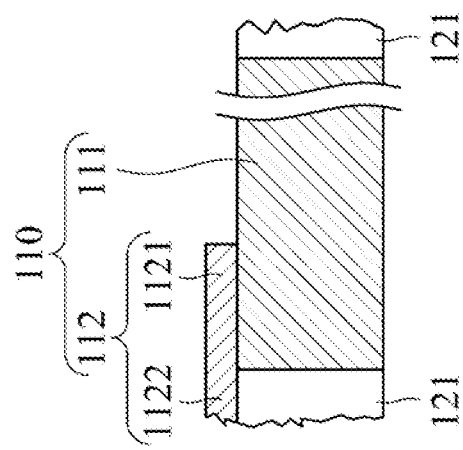
FIG. 6 is a cross-sectional view along the sectional line B-B of FIG. 5.
Figure 5:
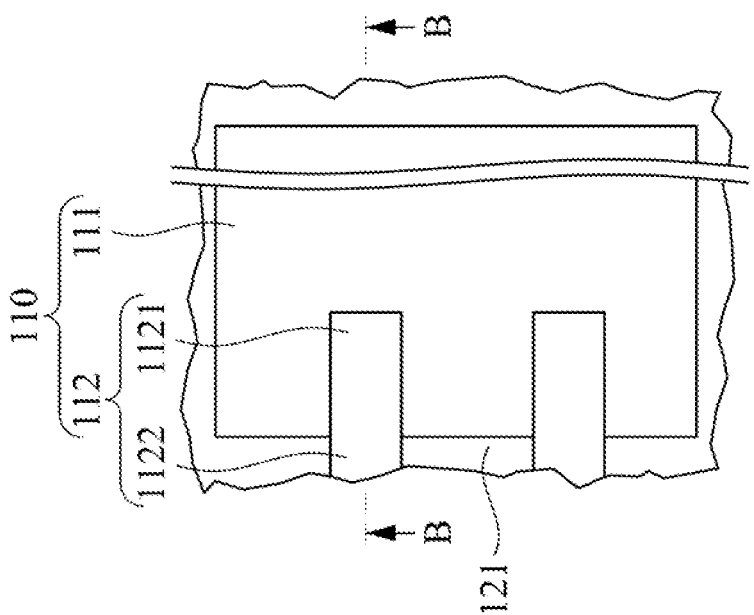
FIG. 5 is a top view of one of the chips of FIGS. 3-4, in which cutting is finished.

Reference is made to FIGS. 5-6. FIG. 5 is a top view of one of the chips 110 of FIGS. 3-4, in which cutting is finished. FIG. 6 is a cross-sectional view along the sectional line B-B of FIG. 5. During the process of cutting after testing by the probe 200, the dummy connectors 121 are regarded as scribe lines and are destroyed by cutting, such that the chips 110 are individually cut from the wafer structure 100 (please refer to FIG. 1 for the wafer structure 100), as shown in FIGS. 5-6. In practice, the probing portions 1122 are destroyed as well because the probing portions 1122 are respectively located on a corresponding one of the dummy connectors 121. As mentioned above, since scratches or damages due to testing by the probe 200 will only be formed on the probing portion 1122 but not the bonding portion 1121 of each of the conductive pads 112, the bonding portions 1121 remained on the bodies 111 after the process of cutting are free of scratches or damages due to testing by the probe 200, which effectively improves the subsequent processes of manufacture of the chips 110.

Figure 7:
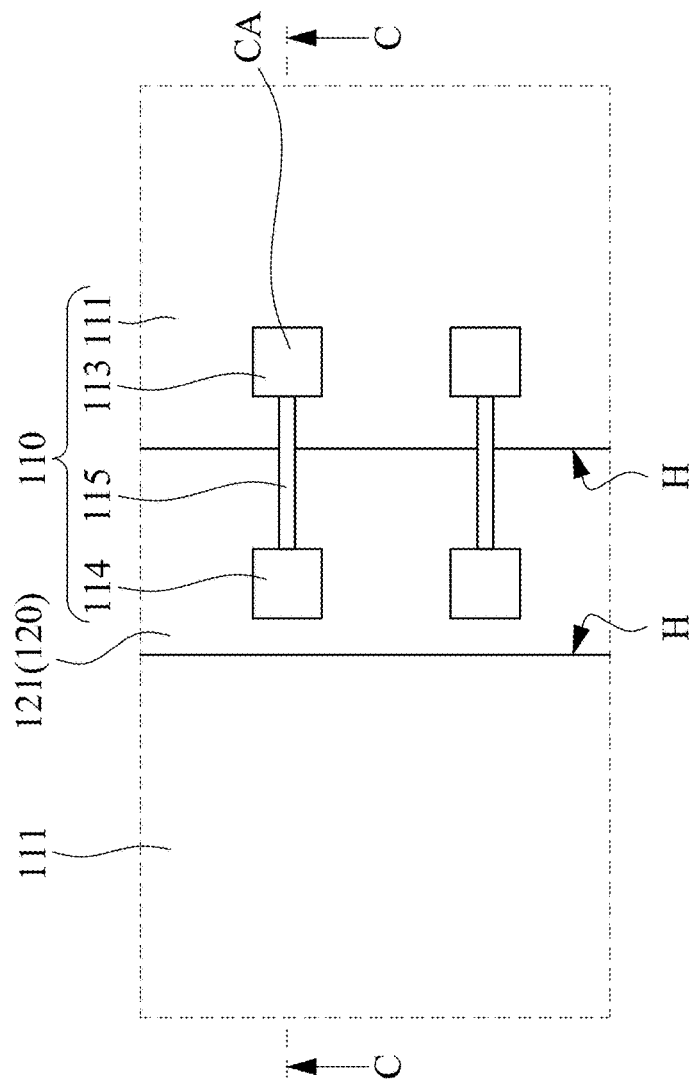
FIG. 7 is an enlarged top view of a wafer structure according to another embodiment of the present disclosure.
Figure 8:
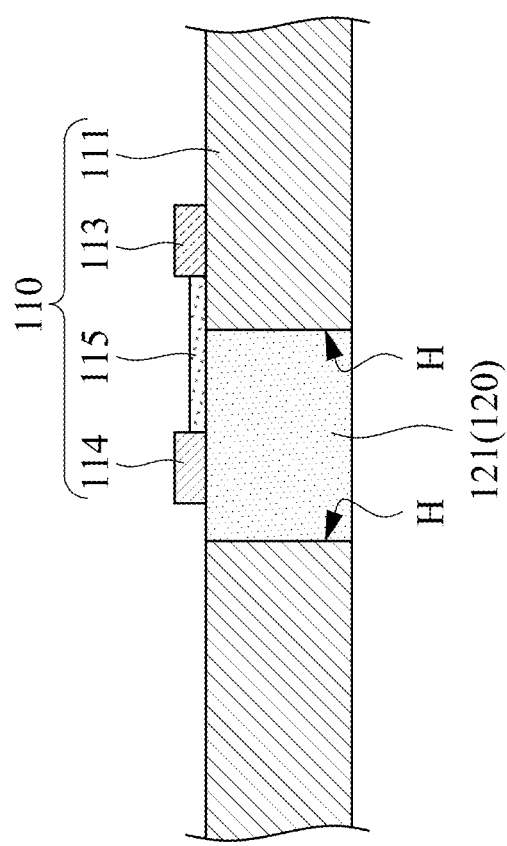
FIG. 8 is a cross-sectional view along the sectional line C-C of FIG. 7.

Reference is made to FIGS. 7-8. FIG. 7 is an enlarged top view of a wafer structure 100 according to another embodiment of the present disclosure. FIG. 8 is a cross-sectional view along the sectional line C-C of FIG. 7. In this embodiment, as shown in FIGS. 7-8, each of the chips 110 includes a body 111, a plurality of bonding pads 113, a plurality of probing pads 114 and a plurality of connecting wires 115. The bonding pads 113 are disposed on the body 111 while the probing pads 114 are disposed on a corresponding one of the dummy connectors 121 of the dummy plate 120. The probing pads 114 are respectively configured to be contacted by a probe 200 (please take reference to FIG. 4 for the probe 200). The bonding pads 113 are separated from each other while the probing pads 114 are also separated from each other. The connecting wires 115 are respectively and electrically connected between a corresponding one of the bonding pads 113 and a corresponding one of the probing pads 114.

In this embodiment, as shown in FIG. 7, a size of each of the bonding pads 113 and a size of a corresponding one of the probing pads 114 are equal. Furthermore, for example, each of the bonding pads 113 has a contact area CA, and a range of the contact area CA is between 100 μm² and 3600 μm². In other words, each of the bonding pads 113 has a relatively less area coverage over a corresponding one of the bodies 111. In this way, more area of the body 111 of each of the chips 110 can be released for other usage, which effectively facilitates the design improvement of the chips 110.

Taking a chip of model 2 GB LPDDR4 as an example, in which the body 111 has an area of 8 mm² (e.g., a rectangle of 2,000 μm×4,000 μm), when the contact area CA of each of the bonding pads 113 is equal to 100 μm² (e.g., a square of 10 μm×10 μm), a total of 200 pieces of the bonding pads 113 disposed on the body 111 will lead to an area occupation of only 0.25% on the body 111.

Taking a chip of model 8 GB LPDDR4 as another example, in which the body 111 has an area of 32 mm² (e.g., a rectangle of 4,000 μm×8,000 μm), when the contact area CA of each of the bonding pads 113 is equal to 100 μm² (e.g., a square of 10 μm×10 μm), a total of 200 pieces of the bonding pads 113 disposed on the body 111 will lead to an area occupation of only 0.0625% on the body 111.

Figure 9:
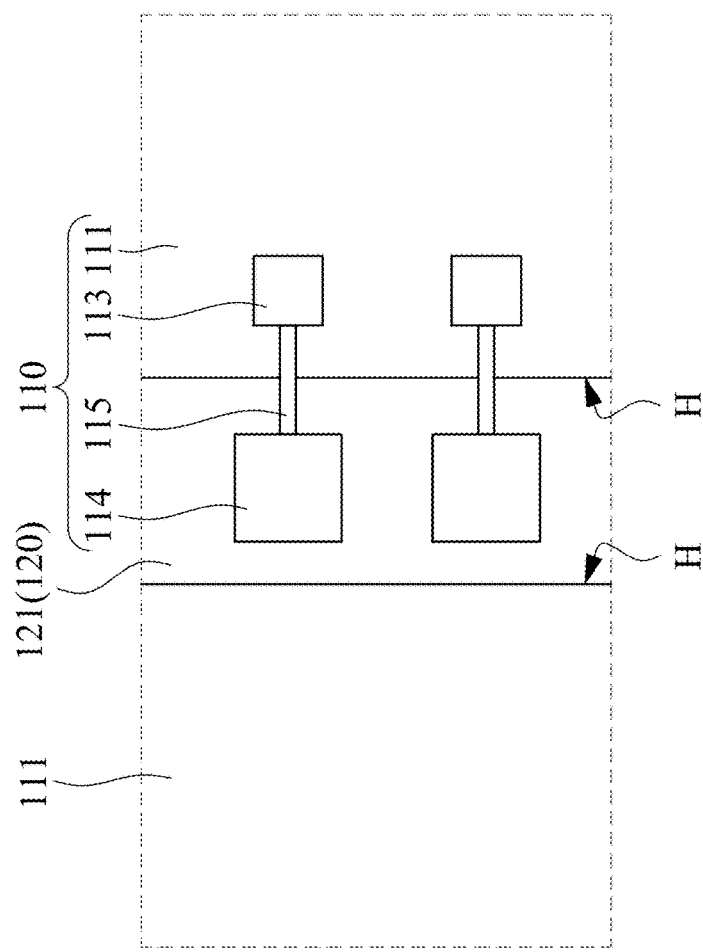
FIG. 9 is an enlarged top view of a wafer structure according to a further embodiment of the present disclosure.

Reference is made to FIG. 9. FIG. 9 is an enlarged top view of a wafer structure 100 according to a further embodiment of the present disclosure. According to the actual situations, a size of each of the bonding pads 113 and a size of a corresponding one of the probing pads 114 are different. For example, as shown in FIG. 9, a size of each of the probing pads 114 is larger than a size of a corresponding one of the bonding pads 113.

In conclusion, the aforementioned embodiments of the present disclosure have at least the following advantages:

(1) Since the bonding portion of each of the conductive pads has a relatively less area coverage over a corresponding one of the bodies, more area of the body of each of the chips can be released for other usage, which effectively facilitates the design improvement of the chips.

(2) Since scratches or damages due to testing by the probe will only be formed on the probing portion but not the bonding portion of each of the conductive pads, the bonding portions remained on the bodies after the process of cutting are free of scratches or damages due to testing by the probe, which effectively improves the subsequent processes of manufacture of the chips.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A wafer structure, comprising:
   a plurality of chips separated from each other, each of the plurality of chips comprising:
      a body; and
      a plurality of conductive pads respectively and at least partially disposed on the body; and
   a plurality of dummy connectors connected with each other, each of the plurality of dummy connectors being connected between adjacent two bodies,
   wherein each of the plurality of conductive pads is further at least partially disposed on a corresponding one of the plurality of dummy connectors.

2. The wafer structure of claim 1, wherein each of the plurality of conductive pads comprises:
   a bonding portion located on a corresponding one of the two bodies; and
   a probing portion connected with the bonding portion and located on a corresponding one of the plurality of dummy connectors, the probing portion is configured to be contacted by a probe.

3. The wafer structure of claim 2, wherein the bonding portion and the probing portion are integrally formed.

4. The wafer structure of claim 2, wherein the bonding portion and the probing portion are arranged along a first direction, the bonding portion has a first width along a second direction perpendicular to the first direction, the probing portion has a second width along the second direction, the first width and the second width are equal.

5. The wafer structure of claim 4, wherein a range of the first width is between 9 μm and 65 μm.

6. The wafer structure of claim 2, wherein the probing portion is separated from an adjacent one of the two bodies.

7. The wafer structure of claim 1, wherein each of the two bodies has a first top surface, each of the plurality of dummy connectors has a second top surface coplanar with the first top surface, each of the plurality of conductive pads is at least partially disposed on corresponding the first top surface and at least partially disposed on a corresponding the second top surface.

8. The wafer structure of claim 1, wherein each of the plurality of conductive pads is of a rectangular shape.

9. The wafer structure of claim 1, wherein the plurality of chips are arranged in a matrix form.

10. The wafer structure of claim 1, wherein the plurality of conductive pads are separated from each other.

11. A wafer structure, comprising:
   a dummy plate having a plurality of through holes; and
   a plurality of chips, each of the plurality of chips comprising:
      a body connected with the dummy plate and located within a corresponding one of the plurality of through holes;
      a plurality of bonding pads disposed on the body;
      a plurality of probing pads disposed on the dummy plate and respectively configured to be contacted by a probe; and
      a plurality of connecting wires respectively and electrically connected between a corresponding one of the plurality of bonding pads and a corresponding one of the plurality of probing pads.

12. The wafer structure of claim 11, wherein a size of each of the plurality of bonding pads and a size of corresponding each of the plurality of probing pads are equal.

13. The wafer structure of claim 11, wherein a size of each of the plurality of bonding pads and a size of corresponding each of the plurality of probing pads are different.

14. The wafer structure of claim 11, wherein the plurality of bonding pads are separated from each other, the plurality of probing pads are separated from each other.

15. The wafer structure of claim 11, wherein each of the plurality of bonding pads has a contact area, a range of the contact area is between 100 $\mu m^2$ and 3600 $\mu m^2$.

* * * * *